(12) United States Patent
Humphrey et al.

(10) Patent No.: US 10,852,801 B2
(45) Date of Patent: Dec. 1, 2020

(54) DETERMINE A FAILURE EVENT OF A POWER SUPPLY

(71) Applicant: Hewlett Packard Enterprise Development LP, Houston, TX (US)

(72) Inventors: Daniel Humphrey, Cypress, TX (US); Stewart Gavin Goodson, II, Houston, TX (US); Stephen Airey, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 86 days.

(21) Appl. No.: 15/706,627

(22) Filed: Sep. 15, 2017

(65) Prior Publication Data

US 2019/0086978 A1  Mar. 21, 2019

(51) Int. Cl.
| | |
|---|---|
| *G06F 1/28* | (2006.01) |
| *G06F 1/30* | (2006.01) |
| *G01R 31/40* | (2020.01) |
| *G01R 31/50* | (2020.01) |
| *H02H 3/24* | (2006.01) |
| *G01R 19/165* | (2006.01) |

(52) U.S. Cl.
CPC ............... *G06F 1/28* (2013.01); *G01R 31/40* (2013.01); *G01R 31/50* (2020.01); *G06F 1/305* (2013.01); *G01R 19/16552* (2013.01); *G06F 1/30* (2013.01); *H02H 3/243* (2013.01)

(58) Field of Classification Search
CPC ........ G06F 1/3202; G06F 1/3231; G06F 1/26; G06F 1/206; G06F 1/3228; G06F 1/08; G06F 1/3289; G06F 1/266; H04L 12/12; H04L 12/10
See application file for complete search history.

(56) References Cited

U.S. PATENT DOCUMENTS

| | | |
|---|---|---|
| 4,510,549 A | 4/1985 | Tedesco |
| 7,581,137 B2 | 8/2009 | Okada et al. |
| 2006/0074405 A1* | 4/2006 | Malackowski .... A61B 17/1613 606/1 |
| 2009/0089604 A1* | 4/2009 | Malik ...................... G06F 1/28 713/340 |
| 2015/0022924 A1 | 1/2015 | Barrenscheen et al. |
| 2015/0247345 A1* | 9/2015 | Carpenter ........... E05B 47/0012 70/277 |
| 2016/0141862 A1 | 5/2016 | Endozo et al. |

(Continued)

FOREIGN PATENT DOCUMENTS

WO    WO-2017019053    2/2017

OTHER PUBLICATIONS

Cobham; "UT01VS33L Voltage Supervisor" Jan. 9, 2017; 16 pages.

*Primary Examiner* — Zahid Choudhury
(74) *Attorney, Agent, or Firm* — Brooks, Cameron & Huebsch, PLLC

(57) ABSTRACT

Example implementations relate to determining a failure event of a power supply. In some examples, an apparatus may comprise logic circuitry coupled to a signal line, the logic circuitry to receive a monitor signal via the signal line, where the monitor signal corresponds to an internal voltage of a power supply that is consumed wholly by the power supply, compare the monitor signal to a reference signal, and determine, based on the comparison, whether a failure event has occurred in the power supply.

19 Claims, 4 Drawing Sheets

436

438 — RECEIVE, BY A SIGNAL LINE OF AN APPARATUS, A MONITOR SIGNAL INCLUDING A MONITOR VOLTAGE

440 — COMPARE, BY LOGIC CIRCUITRY OF THE APPARATUS COUPLED TO THE SIGNAL LINE, THE MONITOR VOLTAGE OF THE MONITOR SIGNAL TO A THRESHOLD VOLTAGE OF A REFERENCE SIGNAL

442 — DETERMINE, BY THE LOGIC CIRCUITRY, A FAILURE EVENT OF A COMPONENT OF A POWER SUPPLY HAS OCCURRED IN RESPONSE TO THE MONITOR VOLTAGE BEING LOWER THAN THE THRESHOLD VOLTAGE

444 — STORING, IN MEMORY OF THE APPARATUS, THE FAILURE EVENT

(56) References Cited

U.S. PATENT DOCUMENTS

2016/0149417 A1* 5/2016 Davis .................... H02J 7/0021
 320/162
2017/0019141 A1* 1/2017 Campbell ................ H04B 1/48
2017/0185094 A1* 6/2017 Atkinson ................. G05F 1/59

* cited by examiner

DETERMINE A FAILURE EVENT OF A POWER SUPPLY

BACKGROUND

A power supply can supply electrical energy to an electrical load. For example, computing devices may be powered via a power supply.

A power supply can receive a power input and deliver a power output. For example, a power supply can receive a power input from a power source and deliver the power output to the electrical load, such as a computing device or components of the computing device.

DETAILED DESCRIPTION

A power supply may monitor components of the power supply and/or power supply outputs. As used herein, the term "power supply" can, for example, refer to a device to supply electrical energy to an electrical load, such as to a computing device and/or components of the computing device. As used herein, the term "computing device" can, for example, refer to a laptop computer, a desktop computer, a server, storage and/or networking equipment, among other types of computing devices.

For example, a power supply can monitor an output from a bias converter of the power supply to a controller of the power supply. As used herein, the term "bias converter" can, for example, refer to a device to establish a predetermined voltage or current at a point along an electric circuit. A failure event external from the bias converter may be detected by the controller and logged by the controller. A failure event logged by the controller may be viewed via a diagnostic of the power supply, and the failure event may be remedied such that the power supply may be utilized.

In some examples, a failure event can occur in the bias converter. A failure event in the bias converter may not be detected by the controller of the power supply. The failure event may not be detected during a diagnostic of the power supply, and the faulty power supply may be utilized following the diagnostic. As a result, a user may receive a faulty power supply following a diagnostic.

In some implementations, determining a failure event of a power supply can allow for a failure event in the bias converter to be detected. Detecting a failure event, such as a failure event in the bias converter of a power supply, can prevent a faulty power supply from being returned to a customer or other user.

Figure 1:
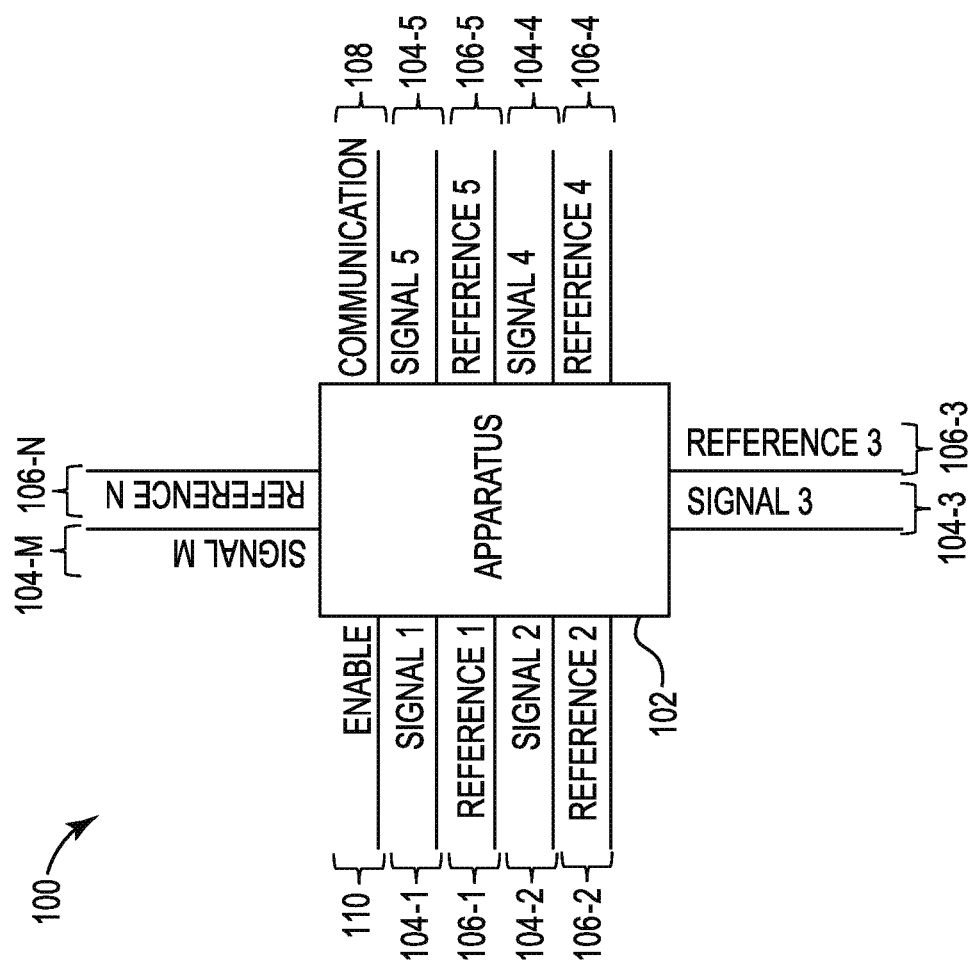
FIG. 1 illustrates an example of a system consistent with the disclosure.

FIG. 1 illustrates an example of a system 100 consistent with the disclosure. As illustrated in FIG. 1, the system 100 may include an apparatus 102, signal line 104-1, 104-2, 104-3, 104-4, 104-5, 104-M (referred to collectively as signal line 104), reference line 106-1, 106-2, 106-3, 106-4, 106-5, 106-N (referred to collectively as reference line 106), communication line 108, and enable line 110.

Apparatus 102 can be included in a power supply. Apparatus 102 can, for example, be a controller, a micro-controller, and/or a state machine, among other apparatuses to determine a failure event of a power supply.

Apparatus 102 can be connected to a bias converter of a power supply. For example, apparatus 102 can be connected to the bias converter of a power supply in order to, for instance, detect a failure event of the power supply. As used herein, the term "failure event" can, for example, refer to an event in which a value has deviated from a standard value. As an example, a failure event may refer to a voltage for the fan of the power supply that has deviated from a normal operating voltage of the fan, as is further described herein.

Apparatus 102 can include logic circuitry. As used herein, the term "logic circuitry" can, for example, refer to a switching circuit including logic gates to perform logical operations on data. The logic circuitry of apparatus 102 can be coupled to signal line 104. As used herein, the term "signal line" can, for example, refer to an electrical line to transmit a signal. As used herein, the term "signal" can, for example, refer to an electrical signal used to convey information. For example, signal line 104 can transmit an electrical signal via an electrical line from a first point to a second point.

The logic circuitry of apparatus 102 can receive a monitor signal via signal line 104. As used herein, the term "monitor signal" can, for example, refer to an electrical signal to convey information about a component of the power supply. The monitor signal can correspond to an internal voltage representing a voltage potential of a bias converter output of a power supply that is consumed wholly by the power supply. As used herein, the term "internal voltage" can, for example, refer to a voltage that is consumed internally by the power supply. In other words, the internal voltage is not consumed by an output load of the power supply, where the output load of the power supply can refer to a power output of the power supply to be delivered to an external electrical load, such as a computing device or components of the computing device.

The monitor signal can be generated by a component of the power supply. For example, a fan input voltage included in the power supply can generate a monitor signal.

The monitor signal may be a voltage of the component of the power supply. Continuing with the example from above, the monitor signal of the fan input voltage of the power supply can be a voltage representing the voltage potential of the bias converter output powering the fan. For instance, the fan input voltage can generate a monitor signal (e.g., voltage) of 10 volts (V).

Although the component of the power supply generating a monitor signal is described as a voltage powering a fan of the power supply, examples of the disclosure are not so limited. For example, components of the power supply can include controllers, memory/logic, buses, switches, and/or sensors, etc.

The logic circuitry of apparatus 102 can compare the voltage of the component of the power supply to a reference signal. As used herein, the term "reference signal" can, for example, refer to an electrical signal for comparison to a monitor signal. The reference signal can be a voltage from reference line 106. For example, the reference signal can be a reference voltage used as a comparison to the voltage of the monitor signal.

The reference signal can be a threshold voltage. For instance, the monitor signal including the voltage of the component of the power supply can be compared against the reference signal including a threshold voltage. For example, the 10 V voltage powering the fan of the power supply, included in the monitor signal from the fan input voltage, can be compared against the reference signal including the threshold voltage (e.g., 11.4 V). In other words, the logic circuitry of apparatus 102 can compare the 10 V voltage for the fan of the power supply to a threshold reference voltage of 11.4 V. The logic circuitry can determine whether a failure event has occurred based on the comparison, as is further described herein.

Each threshold voltage from each reference line 106 can correspond to different components of the power supply. For example, reference line 106-1 can be a reference voltage for the fan of the power supply, and reference line 106-2 can be a reference voltage for a controller of the power supply. Correspondingly, signal line 104-1 can include the signal including the voltage for the fan of the power supply, and signal line 104-2 can include the signal including the voltage of the controller of the power supply. In other words, each threshold reference voltage can be tailored to individual loads in the power supply.

In some examples, the reference signals can be programmed by resistors included in apparatus 102. For example, apparatus 102 can include various resistor dividers utilizing an internal reference voltage. The resistor dividers can scale down voltages to an internal reference, such as 2.5 V. Each monitor signal received on signal lines 104 can be compared against the internal 2.5 V reference after appropriate scaling. Utilizing an internal reference voltage can reduce the line or pin count of apparatus 102.

The logic circuitry of apparatus 102 can compare the monitor signal to the reference signal and determine, based on the comparison, whether a failure event has occurred in the power supply. For example, the logic circuitry can compare a 10 V voltage included in a monitor signal of the input to the fan of the power supply to the 11.4 reference voltage of the reference signal.

Based on the comparison, the logic circuitry can determine that a failure event has occurred. For example, in response to the voltage included in the monitor signal being lower than the threshold reference voltage in the reference signal, the logic circuitry can determine a failure event has occurred in the power supply. The failure event can correspond to a failure of a component of the power supply. For instance, the logic circuitry can determine that a failure event has occurred with respect to the input voltage of the fan of the power supply in response to the monitor signal of the input voltage being 10 V, which is less than the corresponding reference voltage of the motor of the fan (e.g., 11.4 V). The failure event can correspond to a failure of the bias converter which powers the input voltage of the fan of the power supply.

Although the logic circuitry can determine that a failure event has occurred in response to the voltage of the monitor signal being lower than the threshold reference voltage in the reference signal, examples of the disclosure are not so limited. In some examples, the logic circuitry can determine that a failure event has occurred in response to the voltage of the monitor signal being within a threshold percentage of the threshold reference voltage of the reference signal. In some examples, the logic circuitry can determine that a failure event has occurred in response to the voltage of the monitor signal being lower than the threshold reference voltage in the reference signal for a threshold amount of time (e.g., one minute).

In some examples, the reference voltage can be an internal reference voltage utilizing resistor dividers, as described above, where the voltage included in the monitor signal can be compared to the internal reference voltage. The monitor signal received on signal line 104 can be appropriately scaled using the resistor dividers and compared to the internal reference voltage. The logic circuitry can, for example, determine a failure event has occurred in response to the scaled voltage of the monitor signal being lower than the internal reference voltage. For instance, the logic circuitry can determine a failure event corresponding to the motor of the fan has occurred in response to the scaled voltage (e.g., 2 V) being less than the internal reference voltage (e.g., 2.5 V).

Although not shown in FIG. 1 for clarity and so as not to obscure examples of the disclosure, apparatus 102 can include non-volatile memory. The logic circuitry of apparatus 102 can store the failure event in the non-volatile memory, as is further described in connection with FIG. 3.

Although logic circuitry is described above as storing the failure event in non-volatile memory, examples of the disclosure are not so limited. For example, the logic circuitry can store the failure event in volatile memory, among other types of memory.

Apparatus 102 can include communication line 108. As used herein, the term "communication line" can, for example, refer to an electrical line to transmit a communication signal. A communication signal can include a failure event. For example, the logic circuitry of apparatus 102 can transmit the failure event stored in memory via communication line 108. The logic circuitry can transmit the failure event via communication line 108 by serial communication. For example, the logic circuitry can transmit the failure event via logic/high logic/low, pulse width modulation, universal serial bus (USB), RS-232, RS-422, RS-485, RS-488, Ethernet, and/or parallel buses, among other types of serial communication.

As shown in FIG. 1, apparatus 102 can include enable line 110. As used herein, the term "enable line" can, for example, refer to an electrical line to transmit an enable signal. An enable signal can include a signal to enable and/or disable apparatus 102.

For example, the logic circuitry of apparatus 102 can disable apparatus 102 in response to receiving an enable signal via enable line 110. Apparatus 102 can receive the enable signal from a power supply controller of the power supply.

In some examples, the power supply controller can send the enable signal to apparatus 102 to disable apparatus 102 in response to a known failure event occurring in the power supply. For example, a controller of the power supply can disable apparatus 102 when the power supply loses input power (e.g., from a mains source), when the power supply goes out of a known voltage range, etc. Disabling apparatus 102 can prevent the logic circuitry of apparatus 102 from determining and storing failure events when a known failure event is occurring in the power supply (e.g., preventing failure event false positives).

In some examples, the power supply controller can send the enable signal to apparatus 102 to disable apparatus 102 in response to the power supply being in a transient state. For example, a controller of the power supply can disable apparatus 102 when the power supply is being turned on, turned off, or other power cycle conditions. Disabling apparatus 102 can prevent the logic circuitry of apparatus 102 from determining and storing failure events when the power supply is in a transient state (e.g., preventing failure event false positives).

In some examples, the power supply controller can send the enable signal to apparatus 102 to enable apparatus 102 when voltages included in the monitor signals received on signal lines 104 are higher than the threshold voltages of corresponding reference signals. In other words, apparatus 102 can be enabled when voltages of components of the power supply are in a valid state (e.g., a voltage of a monitor signal is higher than a threshold reference voltage).

Determining a failure event of a power supply according to the disclosure can allow for failure events in the power supply that may not be detectable by a power supply controller to be detected and logged. Determining failure events can allow for the power supply to be pulled from service for diagnostics, and be repaired.

Figure 2:
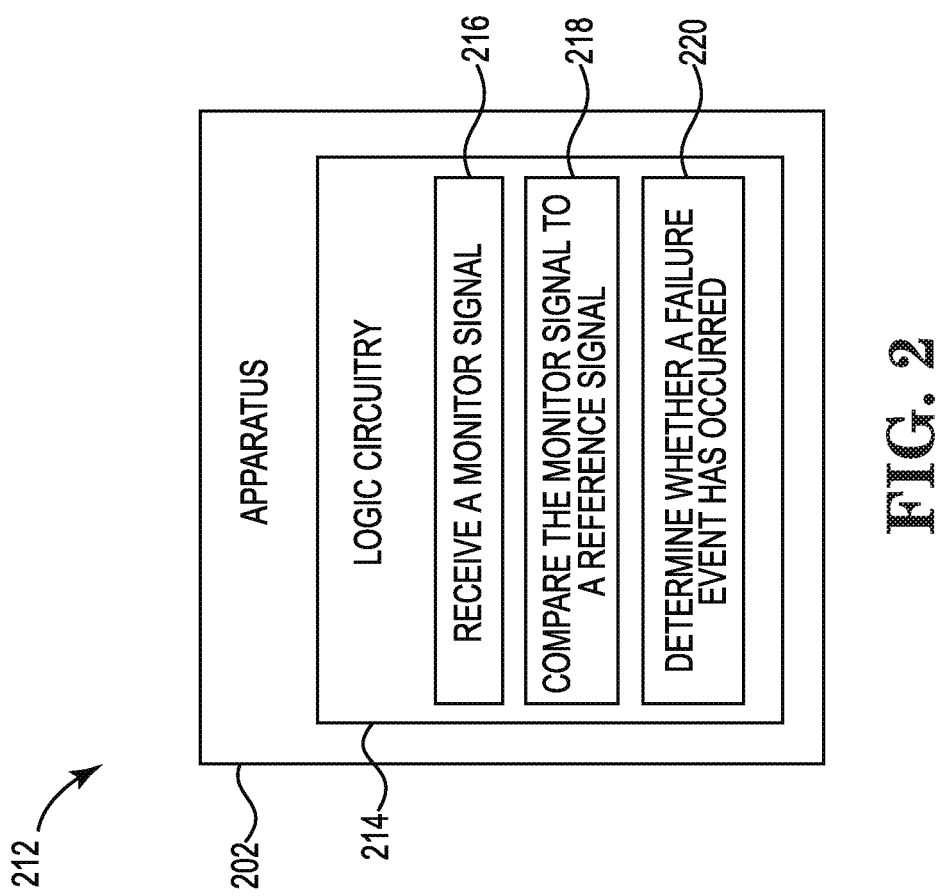
FIG. 2 is a diagram of an example of an apparatus to determine a failure event of a power supply consistent with the disclosure.

FIG. 2 is a diagram 212 of an example of an apparatus 202 to determine a failure event of a power supply consistent with the disclosure. As described herein, the apparatus 202 (e.g., apparatus 102, described in connection with FIG. 1) may perform a function related to determining a failure event of a power supply.

As described in FIG. 1, logic circuitry 214 can perform logical operations on data. The logic circuitry 214 of apparatus 202 can perform operation 216 to receive a monitor signal 216. For example, the logic circuitry 214 can receive a monitor signal via a signal line coupled to the logic circuitry 214. The monitor signal can correspond to an internal voltage of a power supply that is consumed wholly by the power supply. For example, the internal voltage is not consumed by an output load of the power supply, where the output load of the power supply can refer to a power output of the power supply to be delivered to an external electrical load, such as a computing device or components of the computing device.

The logic circuitry 214 of apparatus 202 can perform operation 218 to compare the monitor signal to a reference signal. The monitor signal can be a signal received from a component of the power supply and can include a voltage of the component of the power supply. The voltage of the monitor signal can be compared to a reference voltage of the reference signal, where the reference voltage can be a threshold reference voltage.

The logic circuitry 214 of apparatus 202 can perform operation 220 to determine whether a failure event has occurred. For example, the logic circuitry 214 can determine, based on the comparison of the voltage of the monitor signal to the threshold reference voltage of the reference signal, whether a failure event has occurred in the power supply. The logic circuitry 214 can determine that a failure event has occurred in response to the voltage of the monitor signal being below the threshold voltage of the reference signal.

In this manner, the apparatus 202 may determine a failure event of a power supply. Determining a failure event has occurred in a power supply can allow for a component of the power supply that may have experienced the failure event to be repaired.

Figure 3:
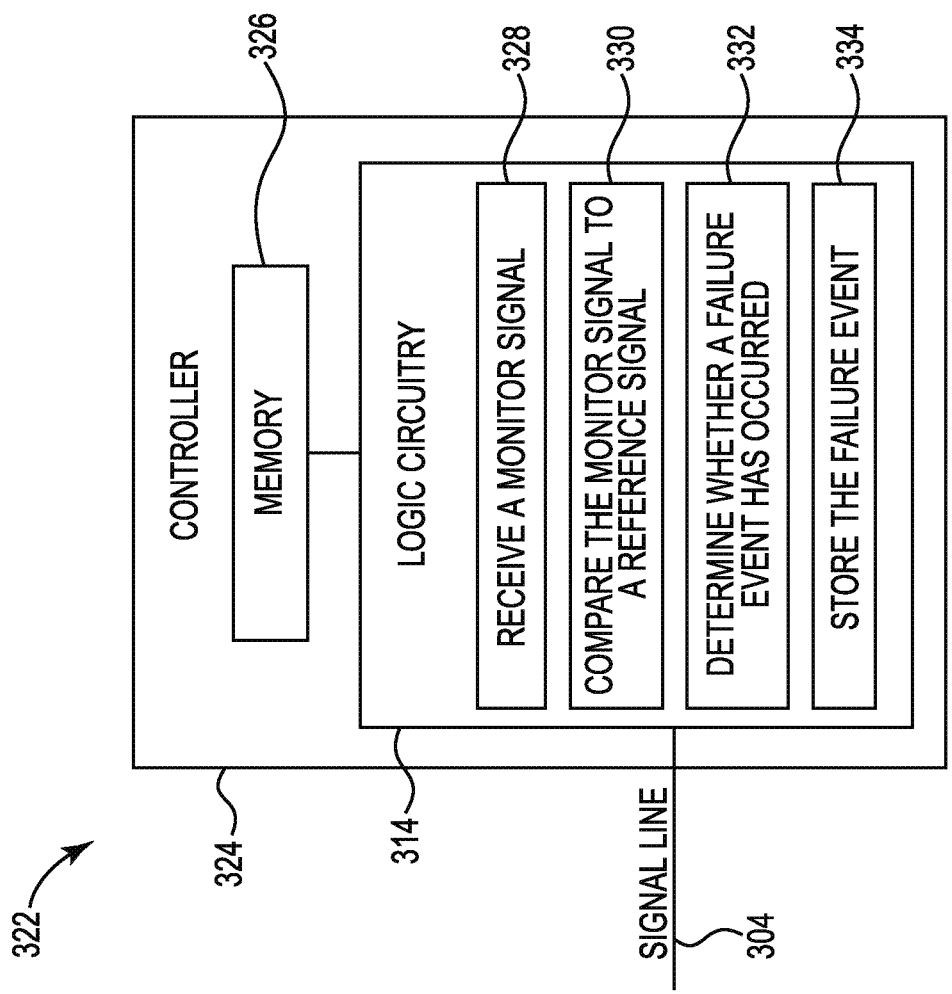
FIG. 3 is a diagram of an example of a controller to determine a failure event of a power supply consistent with the disclosure.

FIG. 3 is a diagram 322 of an example of a controller 324 to determine a failure event of a power supply consistent with the disclosure. As shown in FIG. 3, controller 324 can include memory 326, and logic circuitry 314. The logic circuitry 314 can be coupled to signal line 304. In some examples, memory 326 can include non-volatile memory, such as Electrically-Erasable Programmable Read-Only Memory (EEPROM), etc. In some examples, memory 326 can include volatile memory, such as dynamic RAM (e.g., DRAM) and/or static RAM (e.g., SRAM), among other types of volatile memory.

As described in FIG. 1, logic circuitry 314 can perform logical operations on data. The logic circuitry 314 of controller 324 can perform operation 328 to receive a monitor signal. For example, the logic circuitry 314 can receive a monitor signal via signal line 304. The monitor signal can be generated by a component of the power supply, and can include a monitor voltage. The monitor voltage can correspond to a voltage of the component of the power supply, such as a fan and/or a controller, among other examples of power supply components.

The logic circuitry 314 of controller 324 can perform operation 330 to compare the monitor voltage of the monitor signal to a threshold voltage of a reference signal. The reference signal can include a reference voltage, and the reference voltage can be a threshold voltage.

Although not shown in FIG. 3 for clarity and so as not to obscure examples of the disclosure, the controller 324 can include an enable line. The controller 324 can be enabled via an enable line. For example, logic circuitry 314 of controller 324 can receive an enable signal to enable controller 324 in response to monitor voltage received by signal line 304 being higher than the threshold voltage.

The logic circuitry 314 of controller 324 can perform operation 332 to determine whether a failure event has occurred. For example, logic circuitry 314 can determine, based on the monitor voltage of the monitor signal being lower than the threshold voltage that a failure event has occurred.

The logic circuitry 314 of controller 324 can perform operation 334 to store the failure event. For example, logic circuitry 314 can cause the failure event to be stored in memory 326. The memory 326 can be volatile memory or non-volatile memory.

The logic circuitry 314 of controller 324 can transmit the stored failure event from memory 326. Although not shown in FIG. 3 for clarity and so as not to obscure examples of the disclosure, the memory 326 can be connected to a communication line. The stored failure event can be communicated from memory 326 via the communication line by a serial connection to an external device.

Figure 4:
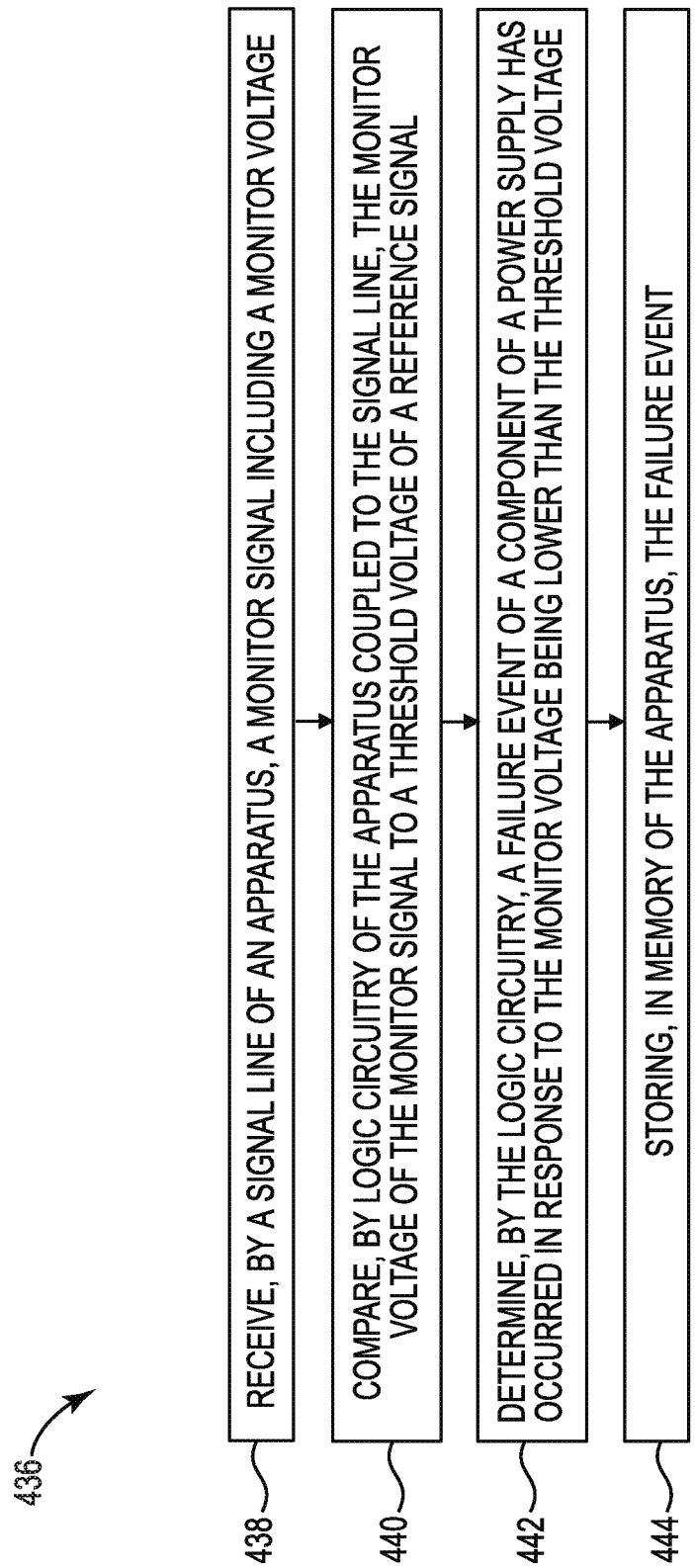
FIG. 4 illustrates an example of a method consistent with the disclosure.

FIG. 4 illustrates an example of a method 436 consistent with the disclosure. Method 436 may be performed by an apparatus (e.g., apparatus 102, 202, described in connection with FIGS. 1 and 2, respectively) or a controller (e.g., controller 324, described in connection with FIG. 3).

At 438, the method 436 may include receiving, by a signal line of an apparatus, a monitor signal including a monitor voltage. The monitor signal can be generated by a component of a power supply. For example, the monitor signal can include a monitor voltage generated by a bias converter for a fan of the power supply, among other examples of components of a power supply. The monitor signal can be received by the signal line of the apparatus from the input voltage of the fan of the power supply.

At 440, the method 436 may include comparing, by logic circuitry of the apparatus coupled to the signal line, the monitor voltage of the monitor signal to a threshold voltage of a reference signal. For example, the voltage for the fan of the power supply can be compared against a threshold voltage.

At 442, the method 436 may include determining, by the logic circuitry, a failure event of a component of the power supply has occurred in response to the monitor voltage being lower than the threshold voltage. For example, the monitor voltage of the input voltage of the fan of the power supply may be 10 V, whereas the threshold voltage is 11.4 V. Based on the monitor voltage of the input voltage of the fan of the power supply being lower than 11.4 V, the logic circuitry can determine a failure event corresponding to the bias converter has occurred.

At 444, the method 436 may include storing, in memory of the apparatus, the failure event. For example, the failure event corresponding to the input voltage of the fan of the power supply may be stored in non-volatile memory.

Method 436 may include transmitting the stored failure event from the non-volatile memory. The stored failure event can be communicated via a communication line coupled to the logic circuitry. The stored failure event can be used to diagnose and repair components of the power supply that may have failed.

In the foregoing detailed description of the disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the disclosure.

The figures herein follow a numbering convention in which the first digit corresponds to the drawing figure number and the remaining digits identify an element or component in the drawing. Similar elements or components between different figures may be identified by the use of similar digits. For example, 102 may reference element "02" in FIG. 1, and a similar element may be referenced as 202 in FIG. 2. Elements shown in the various figures herein can be added, exchanged, and/or eliminated so as to provide a plurality of additional examples of the disclosure. In addition, the proportion and the relative scale of the elements provided in the figures are intended to illustrate the examples of the disclosure, and should not be taken in a limiting sense. As used herein, the designators "M" and "N", particularly with respect to reference numerals in the drawings, indicates that a plurality of the particular feature so designated can be included with examples of the disclosure. The designators can represent the same or different numbers of the particular features. Further, as used herein, "a plurality of" an element and/or feature can refer to more than one of such elements and/or features.

What is claimed:

1. An apparatus, comprising:
   logic circuitry coupled to a signal line, the logic circuitry to:
   receive a monitor signal via the signal line, wherein the monitor signal corresponds to an internal voltage output from a first component of a power supply and consumed by a second component of the power supply;
   compare the monitor signal to a reference signal, which corresponds to a reference voltage, to generate a comparison result; and
   determine that a failure event has occurred in the power supply, when the comparison result indicates that the internal voltage is less than the reference voltage.

2. The apparatus of claim 1, wherein the apparatus comprises non-volatile memory, and wherein the logic circuitry stores the failure event in the non-volatile memory.

3. The apparatus of claim 1, wherein the logic circuitry is further to determine that the failure event has occurred in the power supply comprises:
   the logic circuitry to determine, based on the comparison result, that the first component of the power supply has failed.

4. The apparatus of claim 1, wherein the apparatus is included in the power supply.

5. The apparatus of claim 1, wherein the logic circuit is further coupled to a reference line that provides the reference signal.

6. A controller, comprising:
   a memory; and
   logic circuitry coupled to a signal line, the logic circuitry to:
   receive a monitor signal including a monitor voltage via the signal line, wherein the monitor voltage comprises an internal voltage of a power supply, the internal voltage comprises a voltage generated by a bias converter of the power supply and received by another component of the power supply;
   compare the monitor voltage of the monitor signal to a threshold voltage of a reference signal;
   determine, based on the monitor voltage of the monitor signal being lower than the threshold voltage, that a failure event has occurred; and
   store the failure event in the memory.

7. The controller of claim 6, further comprising an enable line.

8. The controller of claim 7, wherein the logic circuitry is to disable apparatus of the power supply in response to receiving a signal from a power supply controller via the enable line based on a known failure event occurring in the power supply.

9. The controller of claim 7, wherein the logic circuitry is to disable apparatus of the power supply in response to receiving a signal from a power supply controller via the enable line based on the power supply being in a transient state.

10. The controller of claim 6, comprising a communication line, wherein the logic circuitry is to transmit the stored failure event via the communication line by a serial communication.

11. The controller of claim 6, wherein the logic circuitry to determine that a failure event has occurred comprises:
    the logic circuitry to determine, based on the monitor voltage of the monitor signal being lower than the threshold voltage, that the bias converter has failed.

12. A method, comprising:
    receiving, by a signal line of an apparatus, a monitor signal including a monitor voltage internal to a power supply, wherein the monitor voltage comprises a voltage generated by a component of the power supply and received by another component of the power supply;
    comparing, by logic circuitry of the apparatus coupled to the signal line, the monitor voltage of the monitor signal to a threshold voltage of a reference signal;
    determining, by the logic circuitry, a failure event in the power supply has occurred in response to the monitor voltage being lower than the threshold voltage; and
    storing, in memory of the apparatus, the failure event.

13. The method of claim 12, wherein the method includes generating, by the component of the power supply, the monitor signal.

14. The method of claim 12, wherein the method includes transmitting, by the logic circuitry via a communication line connected to the apparatus, the failure event.

15. The method of claim 12, wherein the method includes enabling the apparatus by an enable line in response to the monitor voltage being higher than the threshold voltage.

16. The apparatus of claim 5, wherein the monitor signal and the reference signal are both electrical signals.

17. The controller of claim 6, wherein the logic circuit is further coupled to a reference line that provides the reference signal from a circuit internal to the apparatus.

18. The controller of claim 17, wherein the monitor signal and the reference signal are both electrical signals.

19. The method of claim 12, wherein comparing the monitor voltage to the threshold voltage comprises:

scaling the monitor voltage; and comparing the scaled monitor voltage to a reference voltage provided by a voltage divider circuit internal to the apparatus.

* * * * *